United States Patent [19]
Miyakawa et al.

[11] Patent Number: 6,088,281
[45] Date of Patent: Jul. 11, 2000

[54] SEMICONDUCTOR MEMORY DEVICE

[75] Inventors: Tadashi Miyakawa, Yokohama; Nobuaki Otsuka, Kawasaki; Naoto Tomita, Yokohama, all of Japan

[73] Assignee: Kabushki Kaisha Toshiba, Kawasaki, Japan

[21] Appl. No.: 09/175,445

[22] Filed: Oct. 20, 1998

[30] Foreign Application Priority Data

Oct. 21, 1997 [JP] Japan ..................................... 9-288651

[51] Int. Cl.[7] ...................................................... G11C 7/00
[52] U.S. Cl. .................. 365/225.7; 365/203; 365/185.09
[58] Field of Search ........................... 365/225.7, 186.09, 365/185.25, 203

[56] References Cited

U.S. PATENT DOCUMENTS

| | | | |
|---|---|---|---|
| 5,237,534 | 8/1993 | Tanaka et al. .......................... | 365/208 |
| 5,249,153 | 9/1993 | Conan .................................. | 365/185.25 |
| 5,671,186 | 9/1997 | Igura ...................................... | 365/203 |
| 5,748,529 | 5/1998 | Lee ....................................... | 365/185.17 |

FOREIGN PATENT DOCUMENTS

| | | |
|---|---|---|
| 62-261215 | 11/1987 | Japan . |
| 2-135915 | 5/1990 | Japan . |

*Primary Examiner*—Son Mai
*Attorney, Agent, or Firm*—Banner & Witcoff, Ltd.

[57] ABSTRACT

A semiconductor memory device for a flash EEPROM includes MOS transistors, each used as a fuse element for storing function control data and having a stacked gate structure in which a floating gate and a control gate are stacked on each other, and a sequence control circuit for pre-charging the drain of a MOS transistor as a fuse element upon reception of a predetermined control signal, reading out data from the MOS transistor after the pre-charge operation, and latching the readout data.

27 Claims, 13 Drawing Sheets

| X10 | X9 | X8 | TESTFS | PROTFS | RDFS | TRIMFS | NML | FSELB | |
|---|---|---|---|---|---|---|---|---|---|
| 0 | 0 | 0 | 0 | 0 | 0 | 0 | 1 | 1 | NORMAL MODE |
| 0 | 1 | 0 | 0 | 0 | 0 | 1 | 0 | 0 | TRIMMING FUSE SELECTION |
| 1 | 0 | 0 | 0 | 0 | 1 | 0 | 0 | 0 | REDUNDANCY FUSE SELECTION |
| 1 | 1 | 0 | 0 | 1 | 0 | 0 | 0 | 0 | PROTECT FUSE SELECTION |
| * | * | 1 | 1 | 0 | 0 | 0 | 0 | 0 | TEST DISABLE FUSE SELECTION |

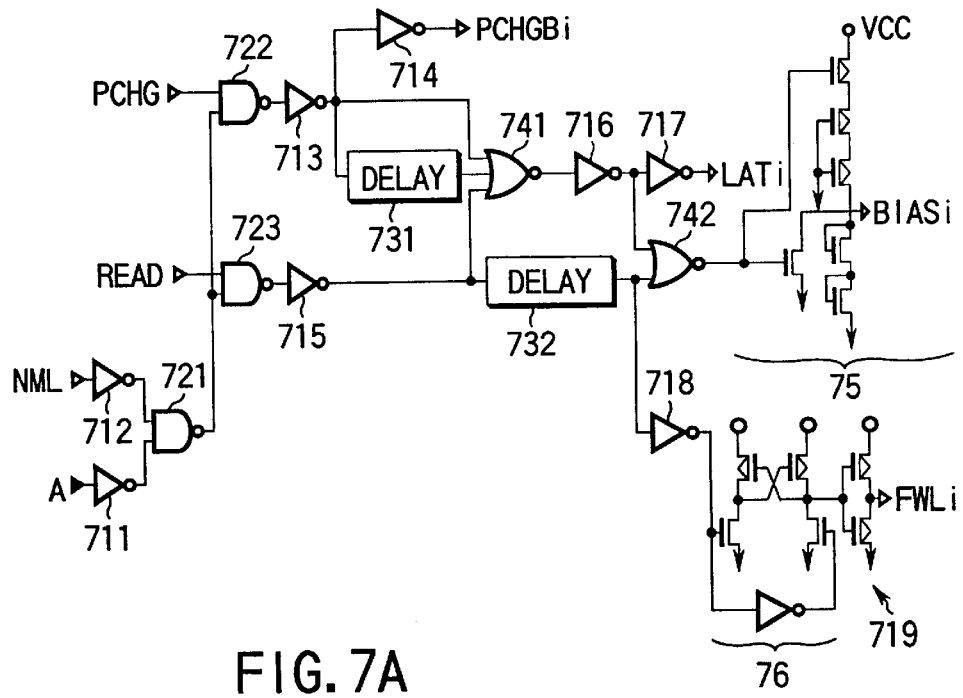
FIG. 7A
| A | FUSE TYPE |
|---|---|
| RDFS | REDUNDANCY FUSE |
| TRIMFS | TRIMMING FUSE |
| PROTFS | PROTECT FUSE |
| TESTFS | TEST DISABLE FUSE |
FIG. 7B
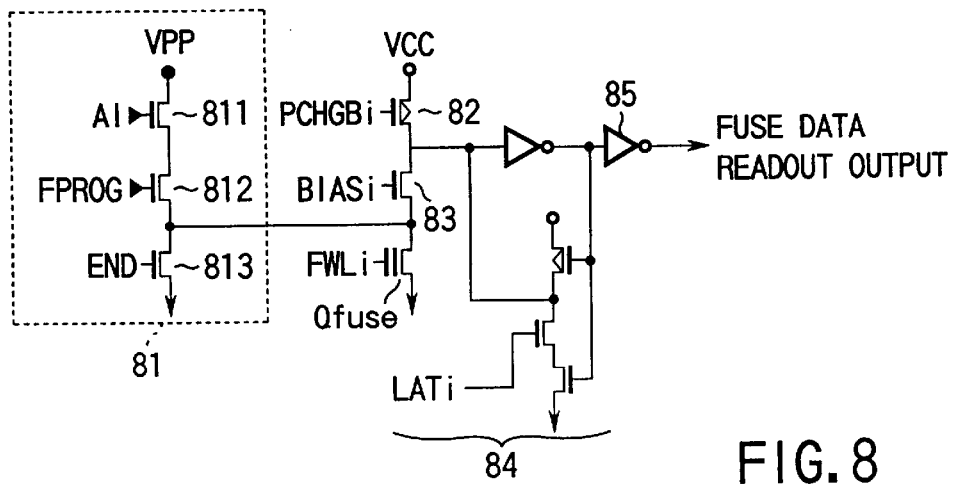
FIG. 8

– 6,088,281 –

SEMICONDUCTOR MEMORY DEVICE

BACKGROUND OF THE INVENTION

The present invention relates to a semiconductor memory device and, more particularly, to a semiconductor memory device which includes a control circuit for reading out stored data from a fuse circuit using an electrically erasable/programmable nonvolatile semiconductor memory cell (EEPROM cell) as memory element for function control data and is used for a batch erasable semiconductor memory such as a flash EEPROM.

EEPROMs have advantages, e.g., the advantage that data in memory cells are not erased after the power is turned off, and hence the demand for these memories have recently increased greatly. A batch erasable flash type EEPROM (flash memory), in particular, in which each memory cell has one transistor, is expected to replace a large-capacity magnetic disk.

In a conventional flash memory, each memory cell used in a cell array includes an NMOS field effect transistor having a stacked gate structure in which a floating gate formed as a charge storage layer and a control gate are stacked in a gate insulating film.

In such a flash memory, a ROM cell that is formed by the same process as that for a cell transistor and has the same structure as that thereof is sometimes used as a memory element (fuse element) storing, for example, redundancy control data, trimming control data, and write-protect control data which are used to control a redundancy function, a trimming function, and a write-protect function.

The redundancy function control data is data for indicating substitute addresses (fail addresses in a main memory cell array) in a redundancy circuit which is used as a measure against fail bits in a main memory cell array in a current large-capacity flash memory.

The trimming data is data for adjusting a trimming circuit used to generate a reference voltage serving as a reference for a write voltage, an erase voltage, and like in a flash memory using a single power supply.

The write-protect control data is data for controlling to inhibit rewriting of data in a designated block in a flash memory using an arrangement in which a memory cell array is divided into blocks.

As described above, the electrical characteristics (the charge amount of the floating gate) of each ROM cell used as a fuse element used to store function control data in the conventional semiconductor memory device vary with time when a voltage for reading out stored data is kept applied to the drain of the fuse element ROM cell. As a result, the stored data may change from the initial state at the start of the use of the device.

BRIEF SUMMARY OF THE INVENTION

It is an object of the present invention to provide a semiconductor memory device which prevents a voltage for reading out stored data from being continuously applied to the drain of an EEPROM cell when the EEPROM cell is used as a fuse element for storing function control data so as to prevent the electrical characteristics of the cell from varying with time (changing in the charge amount of the floating gate), and can control to prevent the stored data from changing from the initial state at the start of the use of the device, thereby attaining improvements in function and reliability.

According to the present invention, there is provided a semiconductor memory device comprising a memory cell array, a memory control section for controlling data read/write with respect to the memory cell array, a sequence control section for controlling sequence operation for realizing a function of the memory control section, and a function control section having at least one fuse circuit storing function control data used by the sequence control section to perform the sequence operation and serving to execute a fuse sequence of pre-charging the fuse circuit in response to at least one of operations including power-on operation and selection of a predetermined function, reading out the function control data after the pre-charge operation, and latching the readout function control data.

The function control section comprises a fuse element including a MOS transistor having stacked gate structure and storing function control data, and a fuse circuit including a fuse element control circuit for pre-charging the fuse element, reading out data from the fuse element after the pre-charge operation, and latching the readout data.

The function control section comprises a plurality of fuse circuits storing function control data corresponding to a plurality of functions including a redundancy function, a trimming function, a write-protect function, and a test disable function, and a plurality of fuse control circuits for respectively controlling the fuse circuits. The function control section includes a fuse selection section for selecting all the plurality of fuse control circuits to read out the function control data from all the plurality of fuse circuits in response to power-on operation or selecting at least one of the fuse control circuits to read out function control data from at least one of the fuse circuits in response to selection of a predetermined function.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 3 is a timing chart showing the timing of main signals associated with an example of fuse data read/latch control operation to be performed when the power to the circuit in FIG. 2 is turned on;

FIG. 7A is a circuit diagram showing a fuse control circuit in FIG. 2;

FIG. 7B is a view showing the types of signals used in the circuit in FIG. 7A;

FIG. 8 is a circuit diagram showing a fuse circuit in FIG. 2;

DETAILED DESCRIPTION OF THE INVENTION

Figure 1:
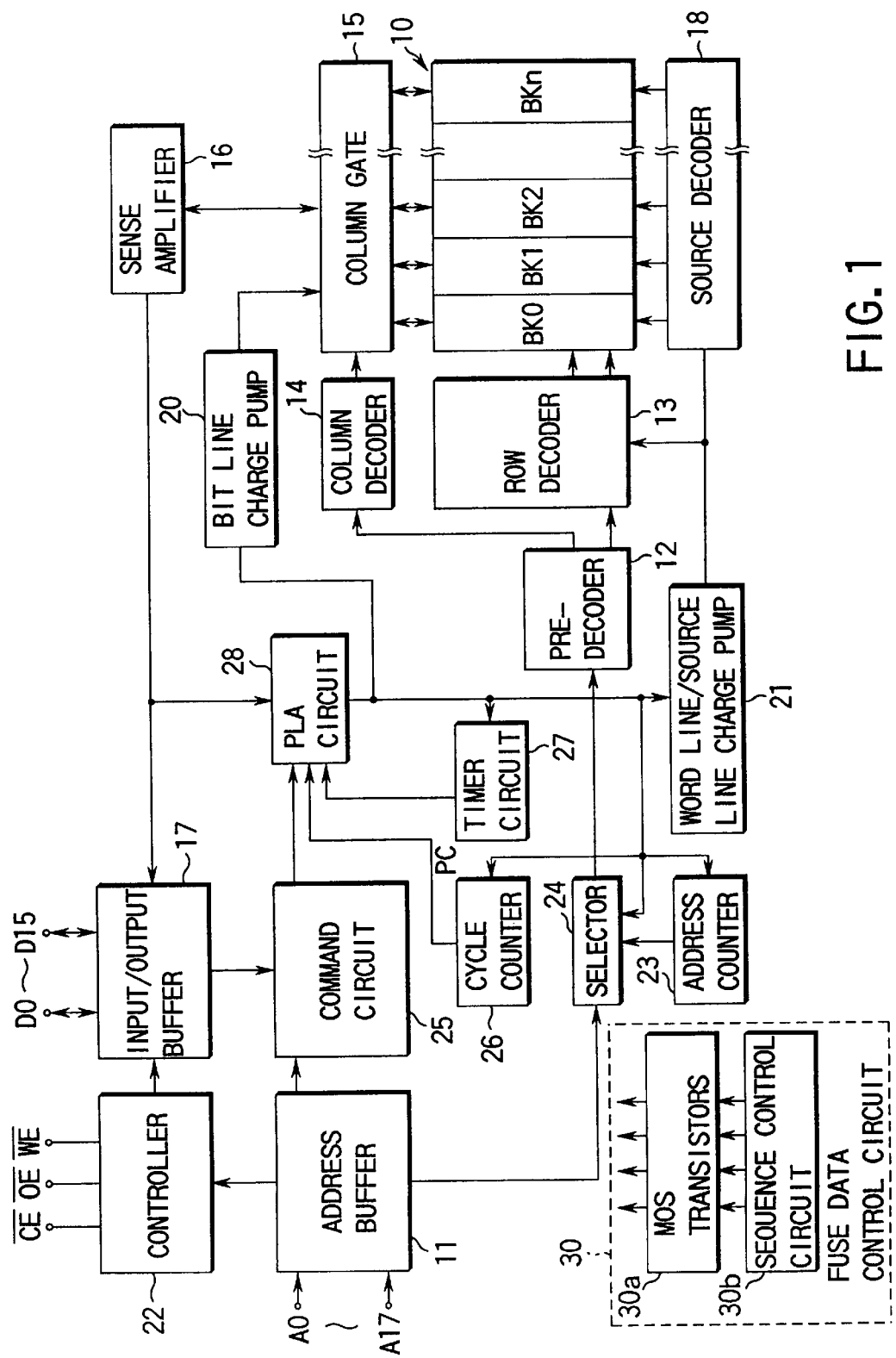
FIG. 1 is a block diagram schematically showing the overall arrangement of a flash EEPROM according to the first embodiment of the present invention.

An embodiment of the present invention will be described in detail below with reference to the accompanying views of the drawing.

FIG. 1 is a block diagram schematically showing the overall arrangement of a NOR type flash EEPROM according to the first embodiment of the present invention.

A flash EEPROM of this embodiment is of a single power supply scheme which incorporates a charge pump circuit for generating a write/erase voltage by boosting a read voltage applied from an external power supply.

The flash EEPROM has the automatic writing function of designating a memory cell as a data write target in a cell array area and automatically writing data therein and the automatic erase function of serially designating cells in the cell array area in units of blocks each including a plurality of cells and automatically erasing data therefrom.

The flash EEPROM also has the cell array save function of saving the cell array by replacing a fail row with a spare row.

Referring to FIG. 1, in a memory cell array 10, memory cells (cell transistors) each including an N-channel MOS-FET having a floating gate and a control gate and forming, for example, a NOR type cell, are arranged in the form of a matrix. This memory cell array is divided into n+1 blocks BK0 to BKn in the row direction.

An address buffer 11 receives, for example, 18 bits address signal A0 to A17 from an external unit through the address input terminals. A pre-decoder 12 is connected to the address buffer 11 through a selector 24 to decode the address signal (internal address signal) from the address buffer 11.

A row decoder 13 is connected to the pre-decoder 12 and has a word line driver for selecting a row of the memory cell array 10 by decoding a row address signal from the pre-decoder 12 and applying a predetermined voltage to the word line in accordance with the decoded output.

A column decoder 14 is connected to the pre-decoder 12 to decode a column address signal from the pre-decoder 12. A column gate 15 is connected to the column decoder 14 and has a bit line driver controlled by the decoded output from the column decoder 14, selecting a column of the memory cell array 10, and applying a predetermined voltage to a bit line.

A sense amplifier 16 is connected to the column gate 15 to sense-amplify information read out from a memory cell and output the resultant information. An input/output circuit (I/O buffer) 17 is connected to the sense amplifier 16 to input and output 16 bits input/output data D0 to D15 through the input and output terminals. A source decoder 18 is connected to the memory cell array 10 and has a source line driver for applying a predetermined voltage to a source line in accordance with the decoded output to select one of the source lines of the blocks BK0 to BKn.

A bit line charge pump 20 applies a high voltage required for write operation to a bit line through the bit line driver of the column gate 15. A word line/source line charge pump 21 is connected to the row decoder 13 and the source decoder 18 and apply high voltages required for write and erase operations to the word line driver of the row decoder 13 and the source line driver of the source decoder 18 to apply the voltages to a word line and a source line.

A controller 22 is used to control the operation of each portion in the EEPROM and is connected to a chip enable ($\overline{CE}$) input terminal, an output enable ($\overline{OE}$) input terminal, and a write enable ($\overline{WE}$) input terminal.

An address counter 23 generates address data for designating the address of a block or memory cell when automatic write or erase is to be performed.

The selector 24 is connected to the address buffer 11 and the address counter 23 to select an address signal from the address buffer 11 and supply it to the pre-decoder 12 in normal operation or to select an address signal output from the address counter 23 and supply it to the pre-decoder 12 in automatic write or erase operation.

A command circuit 25 is connected to the address buffer 11 and the I/O buffer 17 to decode a command signal as a combination of an address signal from the address buffer 11 and an input signal from the I/O buffer 17 and output various control signals to a PLA (Programmable Logic Array) circuit 28.

A cycle counter 26 is used to count the number of times at which the write or erase operations are performed with respect to the memory cell array 10. The PLA circuit 28 is connected to the command circuit 25, the cycle counter 26, and a timer circuit 27 and designed to control sequence operation for realizing the automatic writing function, the erase function, and the cell array save control function. The programmable logic array circuit 28 receives outputs from the command circuit 25, the cycle counter 26, and the timer circuit 27 and a signal from the sense amplifier 16, and outputs a PLA code signal to the bit line charge pumpr 20, the word line/source line charge pumpr 21, the selector 24, the address counter 23, the cycle counter 26, and the timer circuit 27.

Note that a redundancy circuit is formed to improve the manufacturing yield by performing cell array save processing with respect to fail bits detected in the detection step in the manufacturing process for the EEPROM. Although not shown, this redundancy circuit includes redundancy memory cells (redundancy cells) corresponding to several rows, a spare row decoder, a substitution control circuit, and the like. The spare row decoder includes several fail address storage circuits (not shown) for nonvolatile storage of the addresses of fail rows when several fail rows or less are present in the memory cell array 10.

The substitution control circuit of the redundancy circuit may have the function of controlling to select a redundancy memory cell in place of a memory cell whose write or erase characteristics have deteriorated (substitute a redundancy cell for a cell whose characteristics have deteriorated).

A fuse data control circuit 30 associated with a feature of the present invention, which will be described in detail later with reference FIGS. 5A to 10, comprises MOS transistors 30a, each used as a fuse element for storing function control data, formed by the same process as that for a cell transistor and having the same structure as that thereof, and having a stacked gate structure in which a floating gate and a control gate are stacked, and a sequence control circuit 30b for controlling to pre-charge the drain of a MOS transistor as a fuse element upon reception of a predetermined control signal, read out data from the MOS transistor after the pre-charge operation, and latch the readout data.

Figure 2:
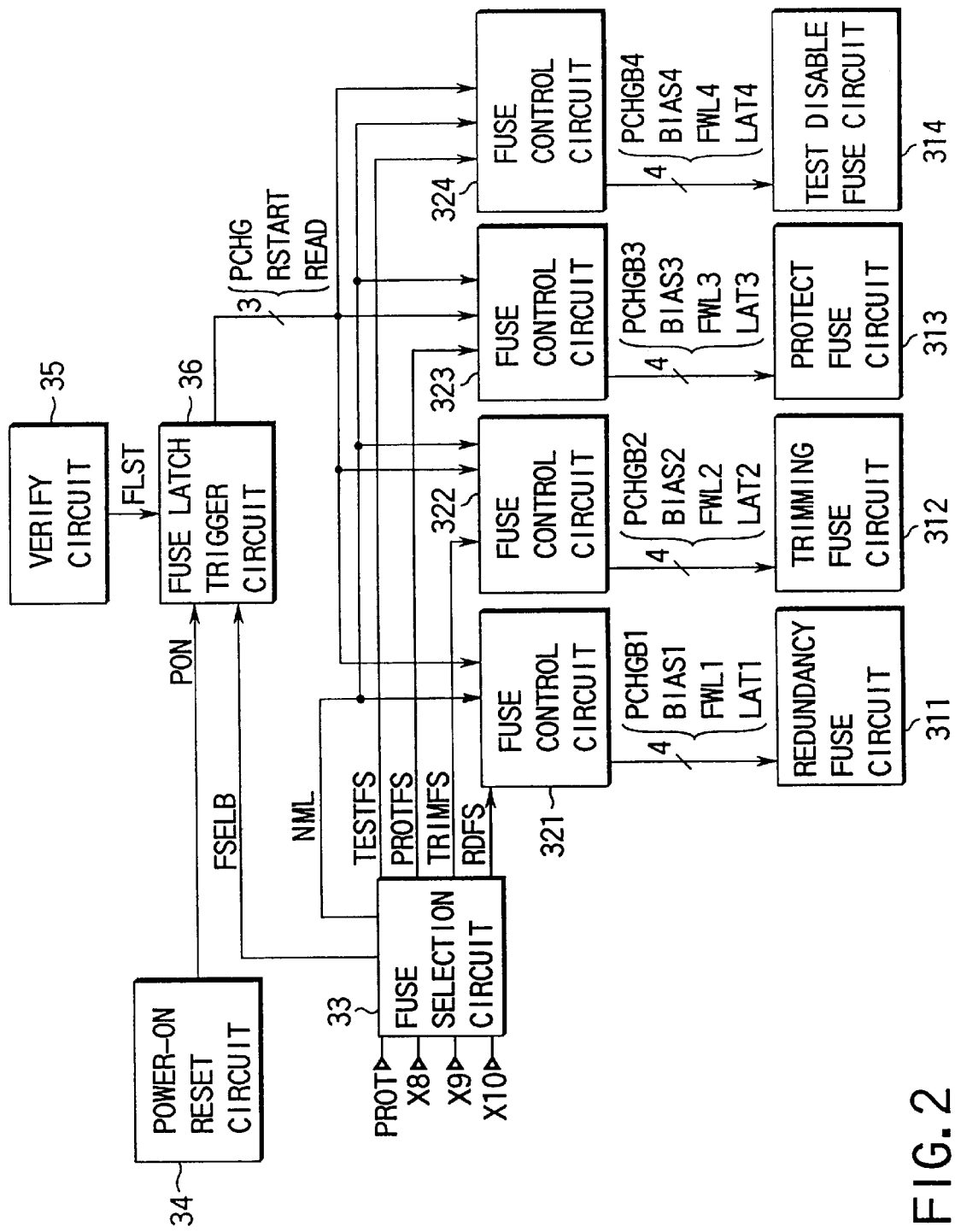
FIG. 2 is a block diagram showing a fuse data read circuit in FIG. 1.

FIG. 2 shows the fuse data control circuit 30 in FIG. 1. Referring to FIG. 2, the fuse data control circuit 30 includes fuse circuits 311 to 314 having fuse elements (MOS transistors each having a stacked gate structure) for storing function control data.

In this case, the redundancy fuse circuit 311 stores redundancy function control data indicating substitute addresses in the redundancy circuit (fail addresses in the main memory cell array). The trimming fuse circuit 312 stores trimming function control data for adjusting the trimming circuit used to generate a reference voltage value as a reference for a write voltage, an erase voltage, and the like. The protect fuse circuit 313 stores write-protect data for controlling to inhibit rewriting of data in a designated block. The test disable fuse circuit 314 stores test disable data for designating inhibition of a memory test according to user's intention.

Fuse control circuits 321 to 324 are driven/controlled in accordance with fuse selection signals RDFS, TRIMFS, PROTFS, TESTFS and NML supplied from a fuse selection circuit 33 (to be described later). Upon reception of a pre-charge signal PCHG, a read trigger signal RSTART, and a readout control signal READ supplied from a fuse latch trigger circuit 36 (to be described later), the fuse control circuits 321 to 324 output pre-charge signals PCHGBi (i=1 to 4), bias voltages BIASi (i=1 to 4), control gate driving signals FWLi (i=1 to 4) for read control, and latch signals LATi (i=1 to 4) as control signals required to perform data read/latch operations of the corresponding fuse circuits 311 to 314.

The fuse selection circuit 33 receives signals X8, X9, X10, and PROT, and generates a control signal FSELB for controlling the fuse latch trigger circuit 36 and the fuse selection signals RDFS, TRIMFS, PROTFS, TESTFS and NML for controlling the fuse control circuits 321 to 324 in accordance with the logic (combination) of the received signals.

In this case, when the power is turned on, the fuse selection circuit 33 generates fuse selection signals to select all the fuse control circuits 321 to 324, whereas after part of the data in the fuse circuit is rewritten, the fuse selection circuit 33 generates fuse selection signals to select some corresponding fuse control circuits. More specifically, when the power is turned on, all the fuse control circuits 321 to 324 are selected by the signal NML. When some of the fuse selection circuits 321 to 324 are to be selected, the fuse selection circuit 33 selects designated at least one of the fuse selection circuits 321 to 324 in accordance with the signals RDFS, TRIMFS, PROTFS and TESTFS.

With this operation, all the fuse control circuits 321 to 324, selected upon power-on, can control to latch the data read out from the corresponding fuse circuits 311 to 314. In addition, latching of the data read out from some fuse circuits corresponding to some fuse control circuits selected upon data write can be controlled.

A verify circuit 35 rewrites part of the fuse data after the power-on, and then outputs a control signal FLST for re-latching the fuse data to the fuse latch trigger circuit 36. The fuse latch trigger circuit 36 is commonly used for the fuse control circuits 321 to 324. The fuse latch trigger circuit 36 operates upon reception of the output signal FLST from the verify circuit 35, and supplies the pre-charge signal PCHG, the read trigger signal RSTART, and the readout control signal READ to the fuse control circuits 321 to 324.

Figure 3:
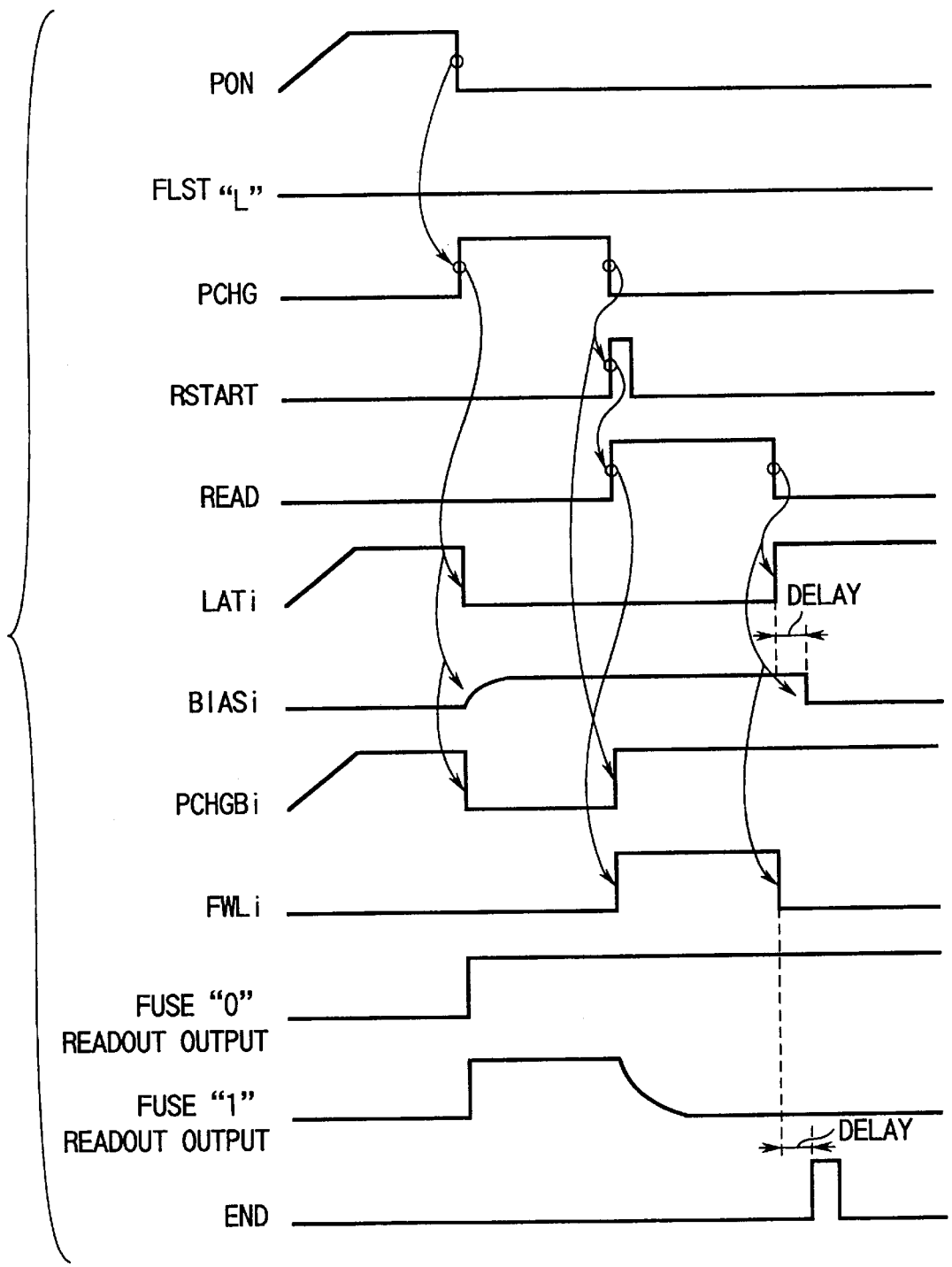

FIG. 3 is a timing chart showing main signals associated with an example of fuse data (Fuse "0", Fuse "1") read/latch control operation of the fuse circuits 311 to 314 when the power to the circuit in FIG. 2 is turned on. In this operation, the output signal FLST from the verify circuit 35 is fixed to "L" level.

When the power-on reset circuit generates the power-on reset signal PON at power-on, the fuse latch trigger circuit 36 outputs the pre-charge signal PCHG, which is kept at "H" level for a predetermined period of time after the falling edge of the power-on reset signal PON, to the fuse control circuits 321 to 324.

The fuse latch trigger circuit 36 also outputs the read trigger signal RSTART and the readout control signal READ, which are set at "H" level in response to the falling edge of the pre-charge signal PCHG, to the fuse control circuits 321 to 324.

Upon reception of the signals from the fuse latch trigger circuit 36, all the selected fuse control circuits 321 to 324 output pre-charge signals PCHGB1 to PCHGB4, bias voltages BIAS1 to BIAS4, control gate driving signals FWL1 to FWL4 for readout control, and latch signals LAT1 to LAT4, which are used to control the operations of the fuse circuits 311 to 314, to the corresponding fuse circuits 311 to 314.

When the pre-charge signals PCHGB1 to PCHGB4 are set at "L" level, the fuse circuits 311 to 314 pre-charge the drains of the MOS transistors as the fuse elements. When the control gate driving signals FWL1 to FWL4 are set at "H" level after the pre-charge operation, the fuse circuits 311 to 314 read out data from the MOS transistors as the fuse elements. When the latch signals LAT1 to LAT4 are set at "H" level, the fuse circuits 311 to 314 latch the readout data.

If the data stored in a MOS transistor as a fuse element is "1" (i.e., a current flows in the fuse element), the readout data is set at "L" level. If the data stored in the MOS transistor as the fuse element is "0" (i.e., no current flows in the fuse element), the readout data is set at "H" level.

With this operation, the data stored in each MOS transistor as a fuse element is read out only when the power is turned on, and hence the voltage stress on the drain of the MOS transistor as the fuse element can be reduced by shortening the interval during which the voltage stress is applied to the drain of the MOS transistor as the fuse element. This can prevent data read errors due to changes in the characteristics of the transistor.

Figure 4:
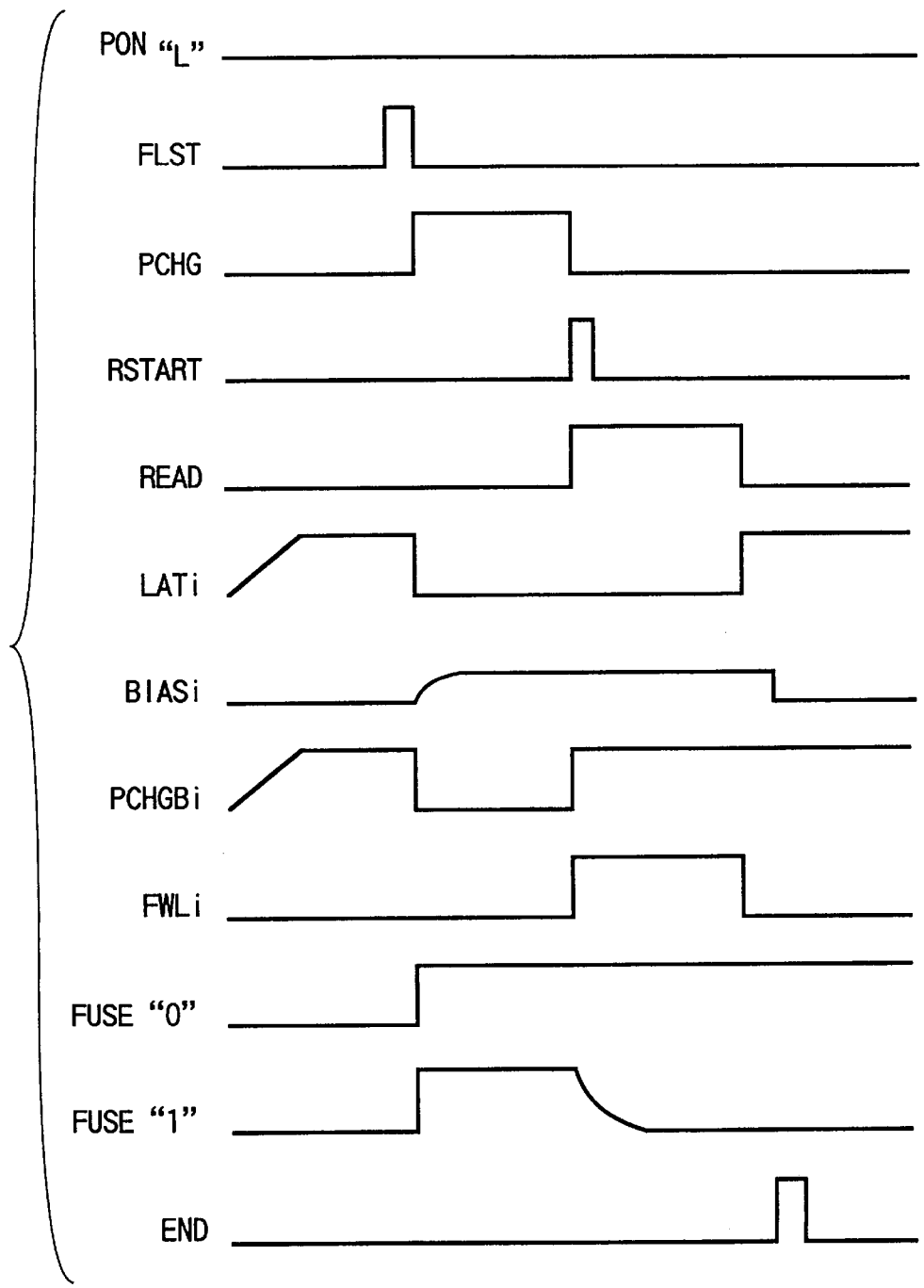
FIG. 4 is a timing chart showing the timing of main signals associated with an example of fuse data read/latch control operation to be performed after fuse data write/erase operation of the circuit in FIG. 2 is performed.

FIG. 4 is a timing chart showing main signals associated with an example of how verify read/latch control operation is performed for fuse data after the fuse data (Fuse "0", Fuse "1") is written/erased in/out some fuse circuits of the circuit in FIG. 2.

This control operation after fuse data write/erase operation is the same as the control operation to be performed when the power is turned on, which is described with reference to FIG. 3, except that the output signal FLST from the verify circuit is input in place of the power-on reset signal PON, and only the fuse data selected by the logic of the signals PROT, X8, X9, and X10 input to the fuse selection circuit 33 is latched (re-latched).

During this operation, the power-on reset signal PON is fixed to "L" level, and the fuse latch trigger circuit 36 outputs the pre-charge signal PCHG, the read trigger signal RSTART, and the readout control signal READ to the fuse control circuits 321 to 324 in response to the signal FLST from the verify circuit 35. The subsequent operation is the same as that in FIG. 3.

As is obvious from the operation described with reference to FIGS. 3 and 4, the fuse latch trigger circuit 36, the fuse selection circuit 33, the fuse control circuits 321 to 324 constitute the sequence control circuit 30b for controlling to receive the predetermined control signal PON or FLST from the power-on reset circuit 34 or the verify circuit 35, pre-charge the drains of the MOS transistors as the fuse elements in accordance with the pre-charge signals PCHGB1 to PCHGB4, read out data from the MOS transistors in accordance with the readout control signals FWL1 to FWL4, and latch the readout data in accordance with the latch signals LAT1 to LAT4.

This sequence control circuit 30b includes a delay circuit to control the timing and time widths (driving time periods) of the pre-charge signals PCHGB1 to PCHGB4 and the readout control signals FWL1 to FWL4, as will be described later. The sequence control circuit 30b also includes a latch circuit to eliminate the influence of the power-on reset signal PON on the pre-charge signals PCHGB1 to PCHGB4 and the readout control signals FWL1 to FWL4, as will be described later.

Each circuit in FIG. 2 will be described in detail below with reference to FIGS. 5A to 10.

Figures 5A, 5B:
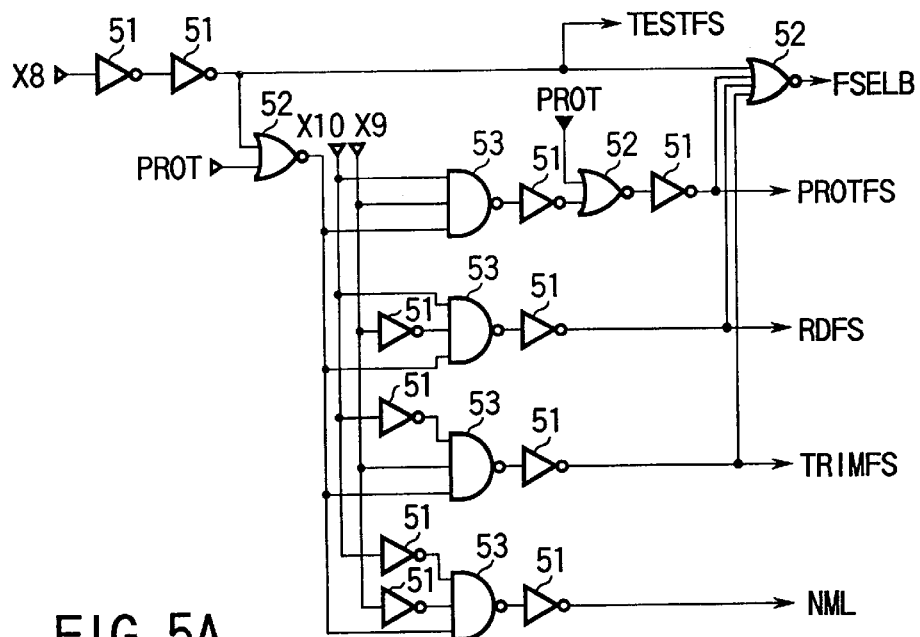
FIG. 5A is a circuit diagram showing a fuse selection circuit in FIG. 2.
FIG. 5B is a view showing the logic levels of signals in the circuit in FIG. 5A.

FIG. 5A shows an example of the fuse selection circuit 33 in FIG. 2. This fuse selection circuit 33 is logically constructed by inverter circuits 51, NOR circuits 52, and NAND circuits 53 to receive the signals X8, X9, X10, and PROT and generate the control signal FSELB for controlling the fuse latch trigger circuit 36, the fuse selection signals RDFS, TRIMFS, PROTFS, TESTFS and NML for controlling the fuse control circuits 321 to 324.

According to this fuse selection circuit, as shown in FIG. 5B, in the normal mode, the normal mode signal NML and the fuse latch trigger control signal FSELB are set at "H" level. As a result, the fuse latch trigger circuit 36 receives the power-on reset signal PON, and all the fuse control circuits 321 to 324 are selected.

In contrast to this, the test mode is determined by a logic of the signals X8, X9 and X10, the normal mode signal NML and the fuse latch trigger control signal FSELB are set at "L" level, and the fuse selection signal RDFS for selecting the fuse control circuit corresponding to the redundancy fuse circuit 311, the fuse selection signal TRIMFS for selecting the fuse control circuit 322 corresponding to the trimming fuse circuit 312, the fuse selection signal PROTFS for selecting the fuse control circuit 323 corresponding to the protect fuse circuit 313, and the fuse selection signal TESTFS for selecting the fuse control circuit 324 corresponding to the test disable fuse circuit 314 are selectively set at "H" level.

In this manner, in the test mode, the manufacturer can select some of the fuse control circuits 321 to 324 and write/read data in/out the selected circuits prior to shipment.

The fuse circuit 313 for storing write-protect data is used to define functions in terms of the specifications of the product and can be selected when the signal PROT is at "H" level as well as in the test mode.

Figure 6:
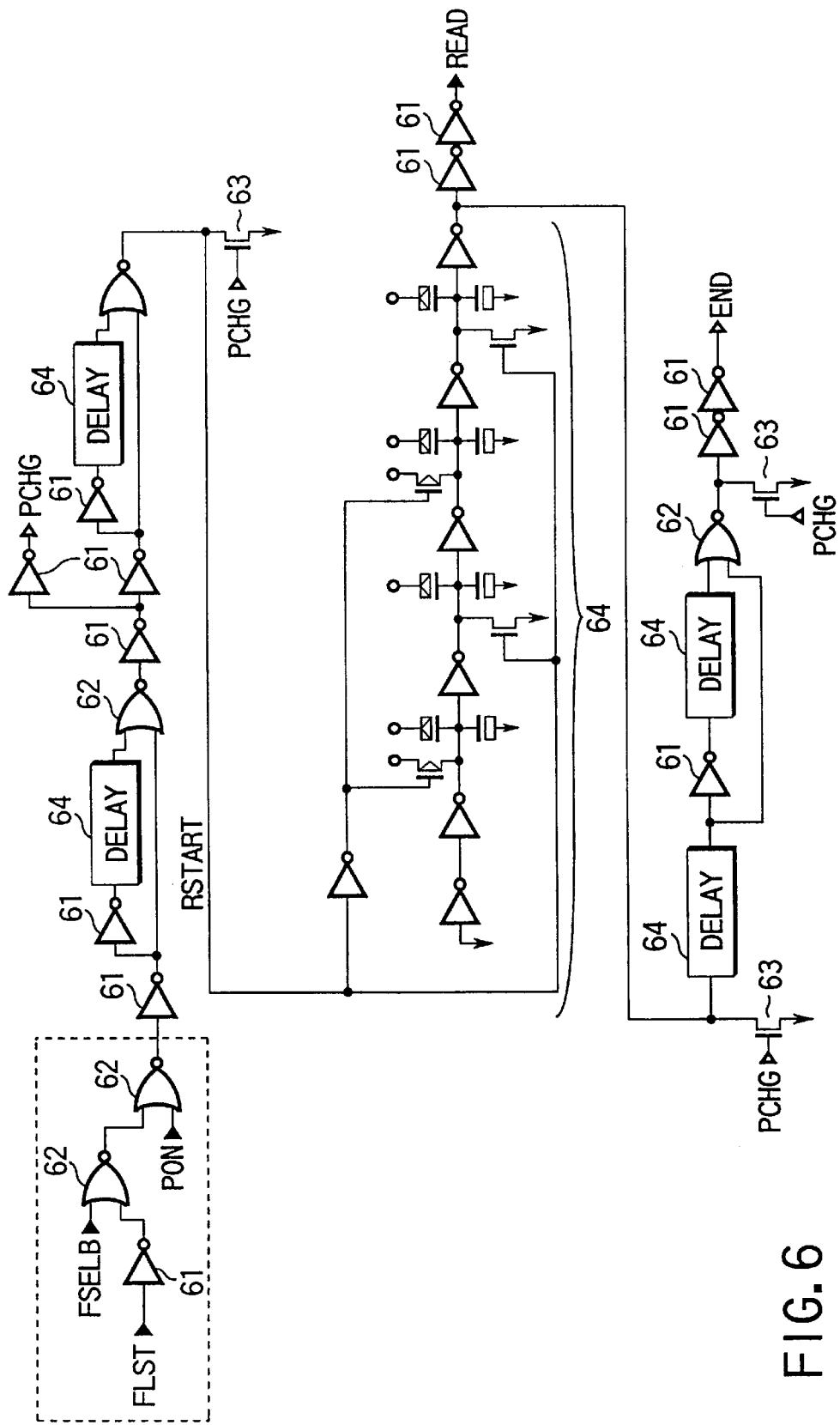
FIG. 6 is a circuit diagram showing a fuse latch trigger circuit in FIG. 2.

FIG. 6 shows an example of the fuse latch trigger circuit 36 in FIG. 2. This fuse latch trigger circuit 36 is logically constructed by inverter circuits 61, NOR circuits 62, NMOS transistors 63, and delay circuits 64 to receive the control signal FSELB from the fuse selection circuit 33 and the power-on reset signal PON from the power-on reset circuit 34 or the verify signal FLST and output the pre-charge signal PCHG, the readout signal READ, and a latch end signal END, as will be described later.

FIG. 7A shows the circuit arrangement of each of the fuse control circuits 321 to 324 in FIG. 2. This fuse control circuit is logically constructed by inverter circuits 711 to 718, NAND circuits 721 to 723, delay circuits 731 and 732, NOR circuits 741 and 742, and the like to receive any of the signals NML, RDFS, TRIMFS, PROTFS and TESTFS from the fuse selection circuit 33 and the pre-charge signal PCHG and the readout signal READ from the fuse latch trigger circuit 36 and generate the pre-charge signals PCHGB1 to PCHGB4, the bias voltages BIAS1 to BIAS4, the readout control signals FWL1 to FWL4, and the latch signals LAT1 to LAT4 which are required for the corresponding fuse elements 311 to 314, as will be described later.

Note that one of the fuse selection signals RDFS, TRIMFS, PROTFS, and TESTFS is input to an input node A in accordance with a corresponding one of the fuse control circuits 321 to 324, as shown in FIG. 7B. More specifically, as shown in FIG. 7A, each of the fuse control circuits 321 to 324 comprises the first inverter circuit 711 for inverting one of the fuse selection signals RDFS, TRIMFS, PROTFS, and TESTFS input from the fuse selection circuit 33 to the input node A, the second inverter circuit 712 for inverting the normal signal NML input from the fuse selection circuit 33, the first NAND circuit 721 to which the outputs from the first and second inverter circuits 711 and 712 are input, the second NAND circuit 722 to which the output from the first NAND circuit 721 and the pre-charge signal PCHG from the fuse latch trigger circuit 36 are input, the third inverter circuit 713 for inverting the output from the second NAND circuit 722, the fourth inverter circuit 714 for inverting the output from the third inverter circuit 713 and outputting the pre-charge signal PCHGBi, the delay circuit 731 for delaying the output from the third inverter circuit 713, the third NAND circuit 723 to which the output from the first NAND circuit 721 and the readout signal READ from the fuse latch trigger circuit 36 are input, the fifth inverter circuit 715 for inverting the output from the third NAND circuit 723, the first NOR circuit 741 to which the outputs from the third inverter circuit 713, the first delay circuit 731, and the fifth inverter circuit 715 are input, the delay circuit 732 for delaying the output from the fifth inverter circuit 715, the sixth inverter circuit 716 for inverting the output from the first NOR circuit 741, the seventh inverter circuit 717 for inverting the output from the sixth inverter circuit 716 and outputting the latch signal LATi, the second NOR circuit 742 to which the outputs from the sixth inverter circuit 716 and the second delay circuit 742 are input, a bias generating circuit 75 for outputting the BIAS voltage BIASi in accordance with the output from the second NOR circuit 742, the eighth inverter circuit 718 for inverting the output from the second delay circuit 732, a latch circuit 76 for latching the output from the eighth inverter circuit 718, and a ninth inverter circuit 719 for inverting the output from the latch circuit 76 and outputting the readout control signal FWLi.

In the fuse control circuit having the arrangement shown in FIG. 7A, when the normal mode signal NML input from the fuse selection circuit 33 is set at "H" level at power-on, all the fuse control circuits 321 to 324 read out data from all the corresponding fuse elements 311 to 314 and latch them.

In contrast to this, after rewrite operation for some fuse circuits, since the input nodes A of selected some fuse control circuit are set at "H" level and the normal mode signal NML input from the fuse selection circuit 33 is set at "L" level, data are read out only from some corresponding fuse circuits and latched.

FIG. 8 shows the circuit arrangement of each of the fuse elements 311 to 314 in FIG. 2. This fuse circuit comprises a MOS transistor Qfuse used as a fuse element for storing function control data and having a stacked gate structure, a write circuit 81 for supplying a write current from the write voltage Vpp (the output voltage from the charge pump circuit, e.g., 8 V) node to the drain of the MOS transistor Qfuse when data is to be written in the fuse element, a pre-charge circuit 82 for pre-charging the drain of the MOS transistor Qfuse at a predetermined timing for a predetermined period of time, a read circuit 83 for reading out the stored data from the MOS transistor Qfuse at a predetermined timing, a latch circuit 84 for latching the readout data, and an inverter circuit 85 for inverting the output from the latch circuit 84 and outputting the resultant data as readout data.

The MOS transistor Qfuse as the fuse element has a source connected to a ground node and a gate to which the control gate driving signal FWLi input from the fuse selection circuit 33 is applied.

Although not described here, the source of the MOS transistor Qfuse may be connected to an erase voltage circuit instead of the ground node to allow erasure of fuse data.

The write circuit 81 is made up of first to third NMOS transistors 811 to 813 connected in series between the Vpp node and the ground node. A high voltage signal AI obtained by decoding an external signal (e.g., an address signal) is applied to the gate of the first NMOS transistor 811. An internal power supply voltage FPROG is set to a constant bias voltage (e.g., 6 V) for setting the drain voltage of the MOS transistor Qfuse as the fuse element to, for example, 5 V in write operation, and applied to the gate of the second NMOS transistor 812. The latch end signal END is applied from the fuse latch trigger circuit 36 to the gate of the third NMOS transistor 813.

The pre-charge circuit 82 includes a PMOS transistor for pre-charging which has a source connected to the Vcc node (external power supply). The pre-charge signal PCHGBi is supplied from the fuse latch trigger circuit 36 to the gate of this transistor.

The read circuit 83 has an NMOS transistor 83 for biasing which is connected between the drain of the PMOS transistor 82 for pre-charging and the drain of the MOS transistor Qfuse as a fuse element. This NMOS transistor 83 for biasing is used to set the drain potential of the MOS transistor Qfuse as the fuse element to about 1 V in data read operation. The bias voltage BIASi of, e.g., 2 V is applied from the fuse latch trigger circuit 36 to the gate of this transistor.

The latch circuit 84 has its input terminal connected to the node between the drain of the PMOS transistor 82 for pre-charging and the drain of the NMOS transistor 83 for biasing, and is driven by the latch signal LATi input from the fuse latch trigger circuit 36.

Note that the control gate driving signal FWLi is kept at "H" level for a predetermined period of time, and is then (after latch operation) set at "L" level. After latch operation, the latch end signal END is kept at "H" level for a predetermined period of time. After data is read out and latched, the drain of the MOS transistor Qfuse as the fuse element is set in a floating state in terms of potential.

In the fuse circuit shown in FIG. 8, in read operation, after the power is turned on, the pre-charge signal PCHG is kept at "H" level for a predetermined period of time in response to the falling edge of the power-on reset signal PON, as shown in FIG. 3. At this time, the fuse circuit pre-charge signal PCHGBi is set at "L" level, and the pre-charge circuit 82 operates. In addition, the bias voltage BIASi is applied to the read circuit 83. As a result, the drain of the MOS transistor Qfuse as the fuse element is pre-charged to about 1 V. After this pre-charge operation, the control gate driving signal FWLi is set at "H" level, and the data in the MOS transistor Qfuse, i.e., the fuse element, is read out. At this time, the latch signal LATi is set at "H" level, and the readout fuse data is latched in the latch circuit 84. Thereafter, the control gate driving signal FWLi is set at "L" level, and hence no data is read out from the fuse element, i.e., the MOS transistor Qfuse. That is, data is read out from the fuse element only when the power is turned on.

Read operation to be performed when the data in some fuse circuits are rewritten will be described next.

In this case, the fuse control circuits (321 to 324) corresponding to the fuse circuits in which the data have been rewritten are selected by the fuse selection circuit 33. At this time, as shown in the timing chart of FIG. 4, the fuse latch trigger circuit 36 supplies the pre-charge signal PCHG, the read trigger signal RSTAT, and the readout control signal READ to the selected fuse control circuits in response to the re-latch control signal FLST. In response to these signals, the selected fuse control circuits output the pre-charge signals PCHGBi (i=1 to 4), the bias voltages BIASi (i=1 to 4), the control gate driving signals FWLi (i=1 to 4) for readout control, and the latch signals LATi (i=1 to 4) to the corresponding fuse circuits (311 to 314). With this operation, the drains of the MOS transistors Qfuse as fuse elements are pre-charged. After this pre-charge operation, the control gate driving signals FWLi are set at "H" level, and data are read out from the MOS transistors Qfuse, i.e., the fuse elements. As described above, when the data in some fuse circuits are rewritten, the fuse data in the corresponding fuse circuits can be read out upon selection by the fuse selection circuit 33 in response to the re-latch control signal FLST as in the case wherein the power is turned on.

The operation described above with reference to FIG. 3 is the case wherein the output signal (power-on reset signal PON) from the power-on reset circuit 34 is generated as one pulse having a predetermined width or more.

It takes several microseconds to several seconds for the power supply voltage Vcc to rise after the power is turned on. If the level of the power supply voltage Vcc slightly fluctuates near the detection reference level of the voltage detection circuit in the LSI, the power-on reset circuit 34 may oscillate. When, therefore, the power-on reset signal PON falls after it temporarily rises at power-on, pulse-like noise may be superimposed on the reset signal.

Figure 9:
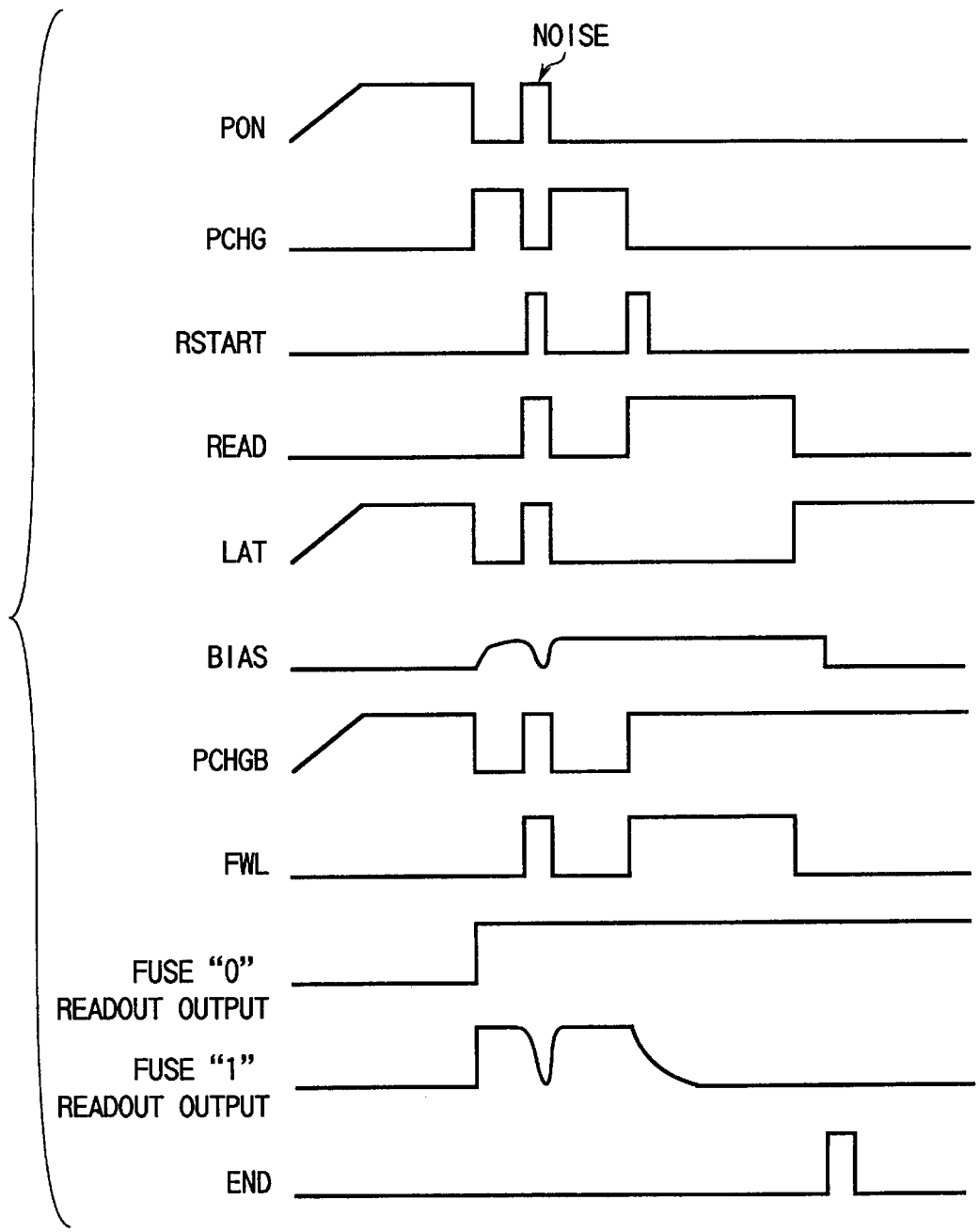
FIG. 9 is a timing chart showing fuse data read/latch control operation to be performed in a case wherein pulse-like noise is superimposed on a power-on reset signal PON when the power-on reset signal falls after it temporarily rises at power-on in the circuit in FIG. 2.

FIG. 9 is a timing chart showing an example of fuse data read/latch control operation to be performed in a case wherein pulse-like noise is superimposed on the power-on reset signal PON when the signal falls after it temporarily rises at power-on.

In this case, if the pulse-like noise is caused before latch operation is complete immediately after fuse data read/latch control operation is started at the falling edge of the power-on reset signal PON, latch control operation cannot be properly performed.

Figure 10:
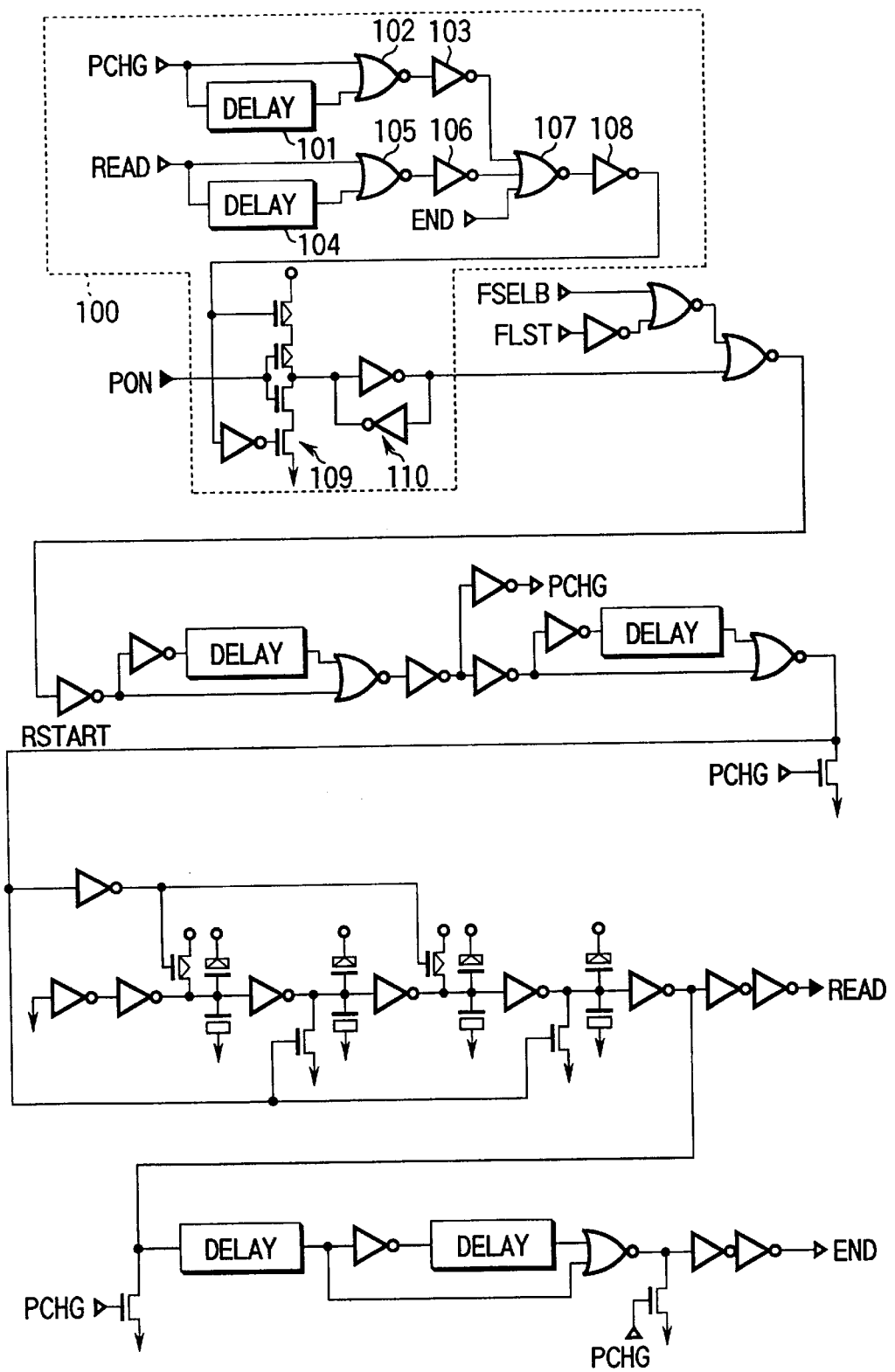
FIG. 10 is a circuit diagram showing a modification of the fuse latch trigger circuit in FIG. 6.

FIG. 10 is a circuit diagram showing an example of how the fuse latch trigger circuit in FIG. 6 is improved to prevent an error in latching fuse data due to noise at power-on as in the above case.

The fuse latch trigger circuit in FIG. 10 is the same as that described with reference to FIG. 6 except that an input control circuit 100 is arranged on the input side for the power-on reset signal PON, and hence the same reference numerals in FIG. 10 denote the same parts as in FIG. 6.

The input control circuit 100 includes a delay circuit 101 for delaying the pre-charge signal PCHG, a NOR circuit 102 to which the delay signal and the pre-charge signal output from the delay circuit 101 are input, an inverter circuit 103 for inverting the output from the NOR circuit 102, a delay circuit 104 for delaying the readout signal READ, a NOR circuit 105 to which the delay signal and the readout signal READ output from the delay circuit 104 are input, an inverter circuit 106 for inverting the output from the NOR circuit 105, a NOR circuit 107 to which the latch end signal END and the outputs from the inverter circuit 103 and the inverter circuit 106 are input, an inverter circuit 108 for inverting the output from the NOR circuit 107, a clocked inverter circuit 109 which is clock-controlled by the output from the inverter circuit 108 and receives the power-on reset signal PON, and a flip-flop circuit 110 having two inverter circuits whose input and output terminals are cross-connected to each other to latch the output from the clocked inverter circuit 109.

The input control circuit 100 operates as follows. When the power-on reset signal PON is input to this circuit to set the pre-charge signal PCHG, the readout signal READ, or the latch end signal END to "H" level, the outputs from the NOR circuit 107 and the inverter circuit 108 are respectively set to "L" and "H" levels, and the clocked inverter circuit 109 is set in the disabled state for a predetermined period of time. Therefore, the input control circuit 100 rejects the power-on reset signal PON (separates the input) for the predetermined period of time. That is, in the fuse latch trigger circuit in FIG. 10, the input control circuit 100 is added to the input side for the power-on reset signal in the fuse latch trigger circuit described with reference to FIG. 6. With this arrangement, the power-on reset signal PON is rejected when the power-on reset signal PON temporarily falls, and the pre-charge signal PCHG, the readout signal READ, or the latch end signal END is set at "H" level in response to this behavior of the power-on reset signal as a trigger.

When, therefore, the fuse control circuits 321 to 324 controls data read/latch operation on the basis of the pre-charge signal PCHG, the readout signal READ, and the latch end signal END, this operation is free from the influence of noise on the power-on reset signal PON.

In other words, after the power-on reset signal PON temporarily rises at power-on and falls, fuse data latch operation can be properly performed without being affected by the power-on reset signal PON until the end of the latch operation regardless of the waveform of the power-on reset signal (even if, for example, pulse-like noise is superimposed on the power-on reset signal PON).

The input control circuit 100 may be modified in another way such that a pulse generating circuit for generating a pulse signal, having a predetermined width at the raising edge or falling edge of an input signal as a trigger, for inhibiting reception of the input signal for a predetermined period of time is used to prevent latch operation from being affected by noise on the power-on reset signal PON.

Figure 11:
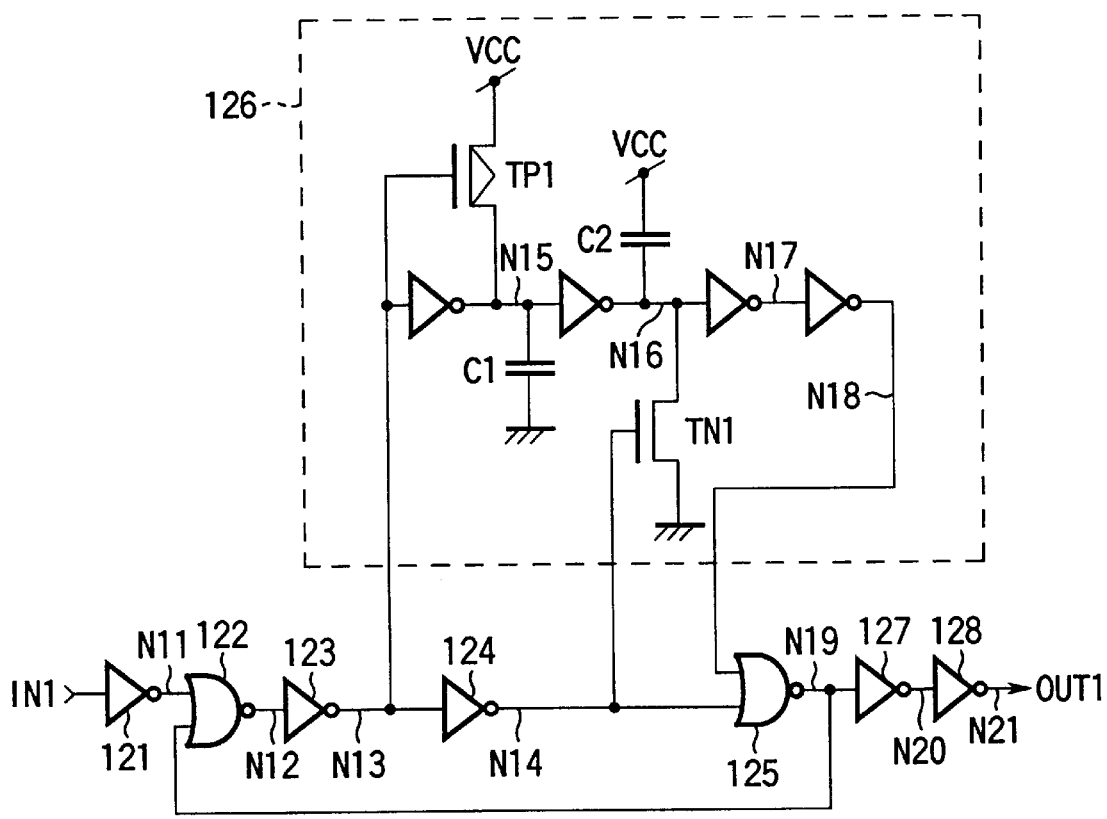
FIG. 11 is a circuit diagram showing an example of a pulse generating circuit that can be used in place of an input control circuit in the fuse latch trigger circuit in FIG. 10.

FIG. 11 shows an example of the pulse generating circuit for generating the above pulse signal.

Referring to FIG. 11, an input signal INI is inverted by an inverter circuit 121 and input to one of the input nodes of a 2-input NOR circuit 122. The output from the NOR circuit 122 is input to one of the input nodes of a 2-input NOR circuit 125 through inverter circuits 123 and 124. The output from the NOR circuit 125 is feedback to the other input node of the NOR circuit 122. The output from the inverter circuits 123 and 124 is input to a delay circuit 126. The output from the delay circuit 126 is input to the other input node of the NOR circuit 125. Note that the output from the inverter circuits 123 and 124 is input as an activation control signal to the delay circuit 126. The output from the NOR circuit 125 passes inverter circuits 127 and 128 to become an output signal OUT1.

Figure 12:
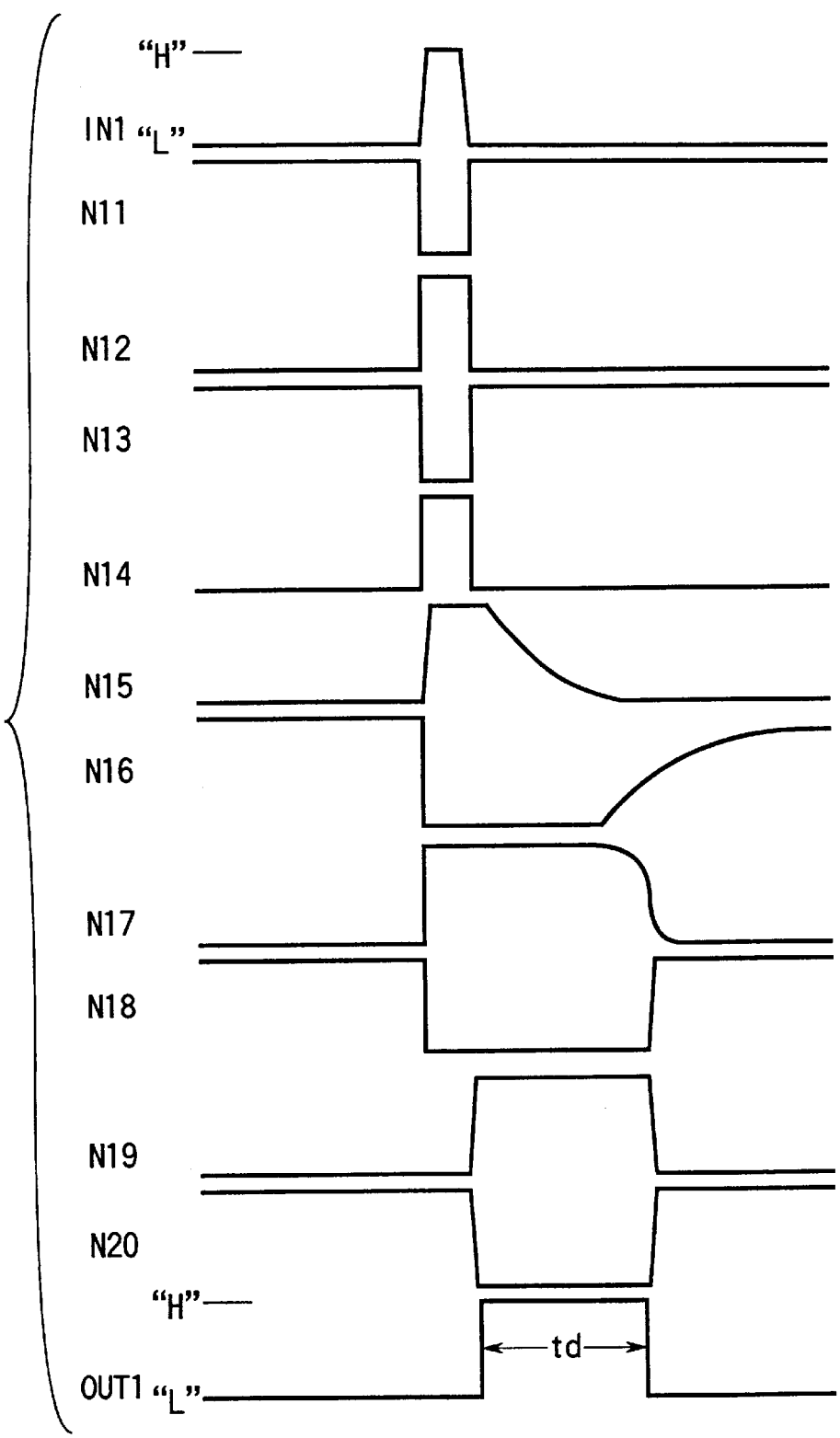
FIG. 12 is a timing chart showing a first example of the operation of the pulse generating circuit in FIG. 11.

FIG. 12 is a timing chart showing a first example of the operation of the pulse generating circuit in FIG. 11, i.e., the potentials of the main nodes when one pulse signal is input to the input node.

Assume that the input signal IN1 is at "L" level, an output node N19 of the NOR circuit 125 is at "L" level, and the output signal OUT1 is at "L" level in the initial state. When the input signal IN1 is set at "H" level in this state, internal nodes N15 and N16 of the delay circuit 126 are initialized to "H" level and "L" level, respectively.

When the input signal IN1 is set at "L" level afterward, a PMOS transistor TP1 and an NMOS transistor TN1 for controlling the operation of the delay circuit 126 are turned off to activate the delay circuit 126. At this time, since an output node N14 of the inverter circuit 124 and an output node N18 of the delay circuit 126 are set at "L" level, the output node N19 of the NOR circuit 125 is set at "H" level. As a result, an output node N12 of the NOR circuit 122 is fixed to "L" level regardless of the logic level of the input signal.

The output node N19 of the NOR circuit 125 is therefore fixed to "H" level until the internal nodes N15 and N16 of the delay circuit 126 go back to "L" level and "H" level, respectively, and the output node N18 of the delay circuit 126 is set at "H" level. Consequently, the output signal OUT1 is kept at "H" level for a delay time td set by the delay circuit 126.

Figure 13:
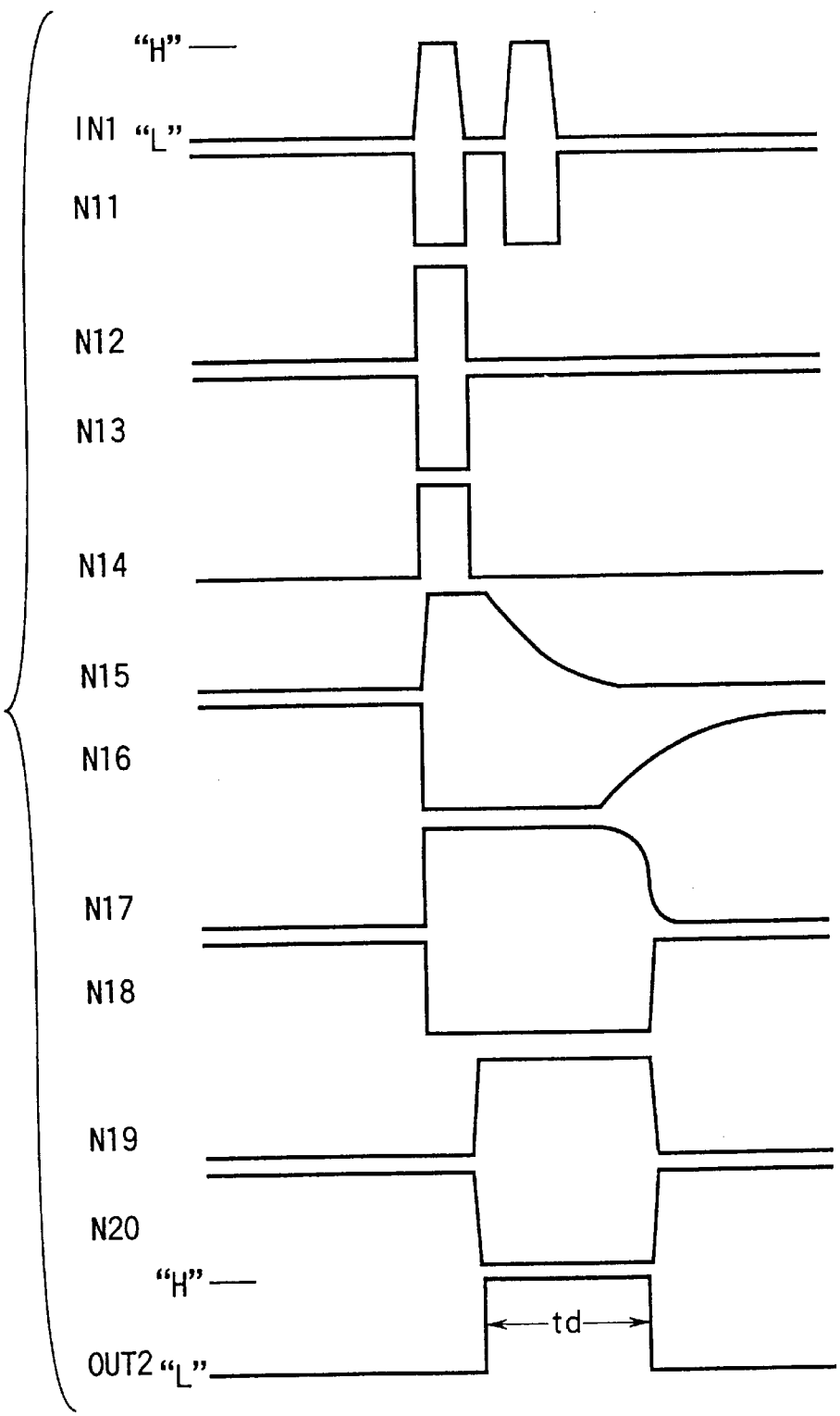
FIG. 13 is a timing chart showing a second example of the operation of the pulse generating circuit in FIG. 11.

FIG. 13 is a timing chart showing a second example of the operation of the pulse generating circuit in FIG. 11, i.e., the potentials of the main nodes when two pulse signals are consecutively input to the input node.

As is obvious from the timing chart of FIG. 13, even if the second pulse signal is input before the output node N19 of the NOR circuit 125 goes back to "L" level after the output node N19 of the NOR circuit 125 is set at "H" level upon input of the first pulse signal, the second pulse signal is rejected.

If the input signal IN1 is the power-on reset signal PON at power-on, the output node N19 of the NOR circuit 125 in FIG. 11 needs to be at "L" level from the initial state after the power is turned on. Assume that the initial state of the output node N19 of the NOR circuit 125 is at "H" level. In this case, if the power-on reset signal PON falls before the output node N19 of the NOR circuit 125 goes back to "L" level, the pulse generating circuit in FIG. 11 may stop operating without generating the pulse-like output signal OUT1.

Figure 14:
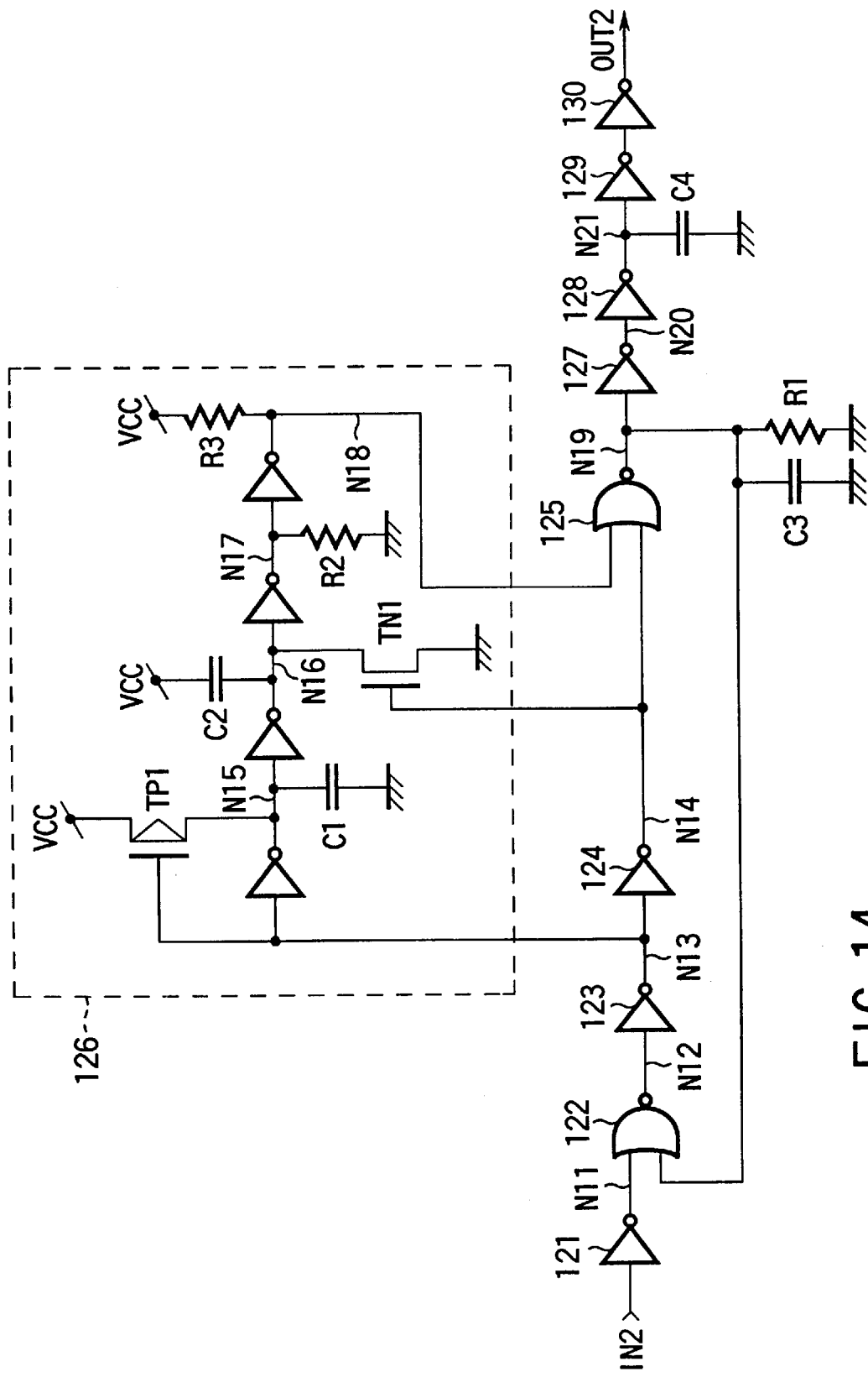
FIG. 14 is a circuit diagram showing a modification of the pulse generating circuit in FIG. 11, which copes with a case wherein an input signal is a power-on reset signal.

FIG. 14 shows a circuit arrangement, as a modification of the pulse generating circuit in FIG. 11, which is designed to cope with a case wherein an input signal IN2 is a power-on reset signal.

The pulse generating circuit in FIG. 14 differs from the pulse generating circuit described above with reference to FIG. 11 in that (1) a resistive element R1 and a capacitor C3 are additionally connected between the output node N19 of the NOR circuit 125 and the ground node to set the output node N19 of the NOR circuit 125 to "L" level from the initial state after the power is turned on, and preferably, (2) a resistive element R2 is additionally connected between the internal node N17 of the delay circuit 126 and the ground node and a resistive element R3 is additionally connected between the output node N18 of the delay circuit 126 and the Vcc node.

In addition, the pulse generating circuit in FIG. 14 differs from the pulse generating circuit described above with reference to FIG. 11 in the following points. In order to prevent a grid-like pulse signal from affecting an output signal OUT2 when the pulse is contained in the input signal IN2, (3) the circuit threshold of the first NOR circuit 122 is set to be lower than that of the inverter circuits 127, and (4) a capacitor C4 is additionally connected between the output node of the inverter circuit 128 and the ground node, and two inverter circuits 129 and 130 are additionally connected to the output side of the inverter circuit 128.

As has been described above, according to the semiconductor memory device of the present invention, when EEPROM cells are used as fuse elements for storing function control data, continuous application of a voltage for reading out the stored data to the drain of each ROM cell as a fuse element is prevented to eliminate the electrical characteristics of each cell from varying with time (changing in the charge amount of each floating gate), thereby performing control without any change in stored data from the initial state at the start of the use of the device. This can attain improvements in performance and reliability.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array;
    a memory control section for controlling data read/write with respect to said memory cell array;
    a sequence control section for controlling a sequence operation for realizing a function of said memory control section; and
    a function control section having at least one fuse circuit storing function control data used by said sequence control section to perform the sequence operation, said function control section executing a fuse sequence of pre-charging said fuse circuit, reading out the function control data after said fuse circuit is precharged, to obtain readout function control data, and latching the readout function control data, in response to at least one of operations including power-on operation and selection of a predetermined function.

2. A device according to claim 1, wherein said function control section comprises a fuse element including a MOS transistor having a stacked gate structure, said fuse element storing the function control data, and a fuse circuit including a fuse element control circuit for pre-charging said fuse element, reading out data from said fuse element after said fuse element is pre-charged, to obtain readout data, and latching the readout data.

3. A device according to claim 1, wherein said function control section comprises a plurality of fuse circuits storing function control data corresponding to a plurality of functions including a redundancy function, a trimming function, a write-protect function, and a test disable function, and a plurality of fuse control circuits for respectively controlling said fuse circuits.

4. A device according to claim 3, wherein said function control section comprises a fuse selection section for selecting all said plurality of fuse control circuits to read out the function control data from all said plurality of fuse circuits in response to a power-on operation.

5. A device according to claim 3, wherein said function control section comprises a fuse selection section for selecting at least one of said fuse control circuits to read out function control data from at least one of said fuse circuits in response to selection of a predetermined function.

6. A device according to claim 3, wherein each of said fuse circuits comprises a fuse element including MOS transistor having a stacked gate structure and storing function control data, and a fuse element control circuit for pre-charging said fuse element, reading out data from said fuse element after said fuse element is precharged, to obtain readout data, and latching the readout data.

7. A device according to claim 1, wherein said function control section keeps said fuse circuit in an inhibit state after the function control data is latched.

8. A device according to claim 1, wherein said function control section comprises a power-on reset circuit for generating a power-on reset signal in response to a power-on operation, and a fuse latch trigger circuit for outputting a pre-charge signal, a readout signal, and a latch end signal in response to the power-on reset signal, and executes the fuse sequence in response to the signals.

9. A device according to claim 8, further comprising an input control circuit for inhibiting reception of the power-on reset signal for a predetermined period of time in response to one of the pre-charge signal, the readout signal, and the latch end signal, said input control circuit being connected to a front stage of said fuse latch trigger circuit.

10. A device according to claim 9, wherein said input control circuit comprises a pulse generating circuit for generating a pulse signal having a predetermined width corresponding to the predetermined period of time.

11. A semiconductor memory device comprising:
    a memory cell array;
    a memory control section which controls reading/writing data with respect to said memory cell array;
    a sequence control section for controlling a sequence operation for realizing a function of said memory control section; and
    a function control section for controlling a read/write of function control data used by said sequence control section to perform the sequence operation, and executing a read of data from said function control section at the time of power-on and selection of a predetermined function.

12. A device according to claim 11, wherein said function control section comprises a fuse element including a MOS transistor having a stacked gate structure, said fuse element storing the function control data, and a fuse circuit including a fuse element control circuit for pre-charging said fuse element, reading out data from said fuse element after said fuse element is pre-charged, to obtain readout data, and latching the readout data.

13. A device according to claim 11, wherein said function control section comprises a plurality of fuse circuits storing function control data corresponding to a plurality of functions including a redundancy function, a trimming function, a write-protect function, and a test disable function, and a plurality of fuse control circuits for respectively controlling said fuse circuits.

14. A device according to claim 13, wherein said function control section comprises a fuse selection section for selecting all said plurality of fuse control circuits to read out the function control data from all said plurality of fuse circuits in response to a power-on operation.

15. A device according to claim 13, wherein said function control section comprises a fuse selection section for selecting at least one of said fuse control circuits to read out function control data from at least one of said fuse circuits in response to selection of a predetermined function.

16. A device according to claim 13, wherein each of said fuse circuits comprises a fuse element including a MOS transistor having a stacked gate structure, said fuse element storing function control data, and a fuse element control circuit for pre-charging said fuse element, reading out data from said fuse element after said fuse element is pre-charged, to obtain readout data, and latching the readout data.

17. A device according to claim 16, wherein said function control section keeps said fuse circuit in an inhibit state after the function control data is latched.

18. A device according to claim 11, wherein said function control section comprises a power-on reset circuit for generating a power-on reset signal in response to a power-on operation, and a fuse latch trigger circuit for outputting a pre-charge signal, a readout signal, and a latch end signal in response to the power-on reset signal, and executes the sequence operation in response to the signals.

19. A device according to claim 18, further comprising an input control circuit for inhibiting reception of the power-on reset signal for a predetermined period of time in response to one of the pre-charge signal, the readout signal, and the latch end signal, said input control circuit being connected to a front stage of said fuse latch trigger circuit.

20. A semiconductor memory device comprising:
a MOS transistor used as a fuse element for storing function control data and having a drain and a stacked gate structure in which a floating gate and a control gate are stacked on each other; and
a sequence control circuit for pre-charging a drain of said MOS transistor upon reception of a predetermined control signal, reading out data from said MOS transistor after the drain of said MOS transistor is pre-charged, to obtain readout data, and latching the readout data, said sequence control circuit including a pre-charge circuit for pre-charging the drain of said MOS transistor at a predetermined timing for a predetermined period of time, a read circuit for reading out the function control data from said MOS transistor at a predetermined timing, a latch circuit for latching the data read out by said read circuit, and a fuse control circuit for sequentially generating a pre-charge signal for driving said pre-charge circuit, a readout control signal for driving said read circuit, and a latch signal for driving said latch circuit.

21. A semiconductor memory device comprising:
a MOS transistor used as a fuse element for storing function control data and having a stacked gate structure in which a floating gate and a control gate are stacked on each other; and
a sequence control circuit for pre-charging a drain of said MOS transistor upon reception of a predetermined control signal, reading out data from said MOS transistor after the drain of said MOS transistor is pre-charged, to obtain readout data, and latching the readout data, said sequence control circuit including a plurality of MOS transistors, a plurality of pre-charge circuits corresponding to said MOS transistors, a plurality of read circuits, a plurality of latch circuits, a plurality of fuse control circuits, a fuse selection circuit for generating a fuse selection signal for selecting one of said plurality of fuse control circuits in accordance with logic of external signals, and a fuse latch trigger circuit which is commonly arranged for said plurality of fuse control circuits, outputs a latch trigger signal upon reception of the predetermined control signal, and commonly supplies the latch trigger signal to said plurality of fuse control circuits, and wherein one of said fuse control circuits which is selected by the fuse selection signal generates a pre-charge signal for driving said pre-charge circuits, a readout control signal for driving said read circuits, and a latch signal for driving said latch circuits upon reception of the latch trigger signal.

22. A device according to claim 21, which further comprises a power-on reset circuit for generating a power-on reset signal at power-on, and a verify circuit for performing verify read with respect to some MOS transistors, of said plurality of MOS transistors as fuse elements, in which data have been rewritten, and the power-on reset signal and a verify end signal are input as control signals to said fuse latch trigger circuit.

23. A device according to claim 22, wherein said fuse selection circuit selects all said plurality of fuse control circuits at power-on, and generates a fuse selection signal for selecting/controlling some corresponding fuse control circuits, of said plurality of fuse control circuits, after data in said some MOS transistors as fuse elements are rewritten.

24. A device according to claim 21, wherein said fuse latch trigger circuit comprises an input control circuit for generating the latch trigger signal in response to a falling edge of a power-on reset signal as a trigger, which is input from said power-on reset circuit, and controlling to inhibit reception of the power-on reset signal during at least the duration of the latch trigger signal.

25. A device according to claim 21, wherein said fuse latch trigger circuit comprises a pulse generating circuit for generating a pulse signal having a predetermined width in response to a falling edge of a power-on reset signal as a trigger, which is input from said power-on reset circuit, and controlling to inhibit reception of the power-on reset signal during the duration of the pulse signal.

26. A device according to claim 20, wherein said sequence control circuit further comprises a write circuit for supplying a write current from a write voltage node to a drain of said MOS transistor when data is to be written therein.

27. A device according to claim 20, wherein the drain of said MOS transistor is controlled in a potential floating state after data is readout therefrom and latched.

* * * * *

UNITED STATES PATENT AND TRADEMARK OFFICE
CERTIFICATE OF CORRECTION

PATENT NO.: 6,088,281
DATED: July 11, 2000
INVENTOR: Tadashi MIYAKAWA *et al.*

It is certified that an error appears in the above-identified patent and that said Letters Patent is hereby corrected as shown below:

It is certified that errors appear in the above-identified patent and that said Letters Patent is hereby corrected as shown below:

On the Title page, in the Assignee data:

"Kabushki" has been replaced with --Kabushiki--.

Signed and Sealed this

First Day of May, 2001

Attest:

NICHOLAS P. GODICI

*Attesting Officer*    *Acting Director of the United States Patent and Trademark Office*